United States Patent

Biggs et al.

[11] Patent Number: 5,876,643
[45] Date of Patent: Mar. 2, 1999

[54] ELECTROMAGNETIC INTERFERENCE SHIELDING

[75] Inventors: Ian Stedman Biggs, Hughenden Valley; Bronislaw Radvan, Flackwell Heath, both of United Kingdom

[73] Assignee: The Wiggins Teape Group Limited, Basingstoke, England

[21] Appl. No.: 751,103

[22] Filed: Nov. 15, 1996

Related U.S. Application Data

[62] Division of Ser. No. 474,383, Jun. 7, 1995, which is a continuation of Ser. No. 554,553, Jul. 19, 1990, which is a continuation of Ser. No. 78,174, Jul. 27, 1987, abandoned, and a division of Ser. No. 554,553, Jul. 19, 1990, which is a continuation of Ser. No. 78,174, Jul. 27, 1987, abandoned.

[30] Foreign Application Priority Data

Jul. 31, 1986 [GB] United Kingdom .................. 96-18736

[51] Int. Cl.$^6$ ....................................................... B28B 1/26
[52] U.S. Cl. ............................ 264/86; 264/104; 264/113; 264/122; 162/101; 162/146
[58] Field of Search ............................ 264/45.3, 86, 104, 264/113, 122; 162/101, 146, 149

[56] References Cited

U.S. PATENT DOCUMENTS

| | | | |
|---|---|---|---|
| 4,734,321 | 3/1988 | Radvan et al. | 428/283 |
| 4,882,114 | 11/1989 | Radvan et al. | 264/129 |
| 4,969,975 | 11/1990 | Biggs et al. | 162/101 |
| 4,973,514 | 11/1990 | Gamble et al. | 428/297 |
| 5,053,449 | 10/1991 | Biggs et al. | 524/493 |
| 5,089,326 | 2/1992 | Bonazza | 428/284 |
| 5,399,295 | 3/1995 | Gamble et al. | 252/511 |

*Primary Examiner*—Mary Lynn Theisen
*Attorney, Agent, or Firm*—Burns, Doane, Swecker & Mathis, L.L.P.

[57] ABSTRACT

A foamed aqueous dispersion of a mixture of particulate plastics material is formed when the fibers are between 5% and 35% of the volume of the mixture, where no more than about 7% of the volume of the mixture is conductive fibers between about 7 and 20 mm long, and where any other fibers are reinforcing fibers with a high modulus of elasticity and between about 7 and about 50 mm long. A web is formed from the foamed dispersion using a wet laying process. The web is dried and compacted under heat and pressure. The compacted web is cooled to form a consolidated element in which the conductive fibers extend as a conductive lattice. The resulting element can be formed or molded into shielding to provide attenuation of electrical or magnetic fields.

9 Claims, 3 Drawing Sheets

ELECTROMAGNETIC INTERFERENCE SHIELDING

This application is (i) a divisional of application Ser. No. 08/474,383, filed Jun. 7, 1995, which is a continuation of application Ser. No. 07/554,553, filed Jul. 19, 1990, which is a continuation of application Ser. No. 07/078,174, filed Jul. 27, 1987, (now abandoned); and (ii) a divisional of application Ser. No. 07/554,553, filed Jul. 19, 1990, which is a continuation of application Ser. No. 07/078,174, filed Jul. 27, 1987, (now abandoned).

BACKGROUND OF THE INVENTION

1. Field of the Invention

This invention relates to electromagnetic interference (EMI) shielding.

2. Description of the Related Art

With much electronic equipment, regulations require shielding to be provided for certain components in order to attenuate the transmission of electrical and magnetic fields which can produce undesired induction currents and static effects. Such shielding is necessarily conductive so that it can be earthed or grounded to prevent a build-up of such currents or static.

Shielding for this purpose has taken the form of covers shaped from an expanded metal sheeting and plastics mouldings coated with metallic paint. It has also been proposed in European Patent Application No. 83401541.4 (Publication No. 100726) to use paper making technology to produce, a web of conductive fibres of up to 6 mm in length and powdered thermoplastics material. The European Patent further proposes the press moulding of a multiplicity of layers of such material into platelets having thicknesses of up to 6 mm which exhibited useful electromagnetic interference shielding properties.

Although European Patent Application No. 83401541.4 (Publication No. 100726) makes reference to the use of metallic fibres of up to 10 mm and of glass fibres of up to 15 mm in length, no example is given of the use of fibres longer than 6 mm or glass fibres longer than 3 mm. This is consistent with the present applicant's experience that it is impossible by conventional wet laying papermaking techniques to produce a satisfactory sheet with fibres longer than about 5 to 6 mm, depending on their thickness. Longer fibres can only be formed into very thin webs from dispersions of very low consistencies (0.1% or less). In forming webs from such dispersions, exceptionally large volumes of water need to be handled in drainage, leading to high capital costs and a very low rate of production. The difficulties in fact make the use of longer fibres impractical using conventional technology.

OBJECTS AND SUMMARY

The present invention is based on the discovery that a given volume of conductive fibres of from about 7 to 20 mm, in length, and especially from about 10 to 15 mm in length, when incorporated in a plastics matrix moulded from a thick web formed in one operation from a foamed dispersion of fibres, produces a significant increase in the electromagnetic interference shielding efficiency compared with the same volume of fibres 6 mm long or less in length. It is believed that the reason for this increase in efficiency lies in the use of longer fibres which produce a larger number of crossover contact points in the fibre lattice within the matrix.

It is among the objects of the present invention to provide a process for producing an element which can form or be moulded into shielding for providing improved attenuation of electrical or magnetic fields.

It is a further object of this invention to provide an element or moulding exhibiting improved attenuation of electrical or magnetic fields.

The invention therefore provides a method of making an element for the foregoing purpose, comprising the steps of:

forming a foamed aqueous dispersion of a mixture of particulate plastics material and fibres, with the fibres comprising between about 5% and about 35% by volume of the mixture, not more than about 7% by volume of the mixture being conductive fibres between about 7 and about 20 mm long, and any other fibres being reinforcing fibres having a high modulus of elasticity as herein defined and being about 7 and about 50 mm long, forming a web from said foamed dispersion by a wet laying process, drying and compacting said web under heat and pressure and, cooling the compacted web to form a consolidated element in which the conductive fibres extend as a conductive lattice.

In another aspect the invention comprises a compacted element having a fibre lattice extending in a matrix of plastics material with the fibres of the lattice comprising between about 5% and about 35% by volume of the mixture, not more than about 7% by volume of the mixture being conductive fibres between about 7 and 20 mm long and any other fibres being reinforcing fibres having a high modulus of elasticity, as herein defined, and being about 7 and about 50 millimeters long.

DESCRIPTION OF THE PREFERRED EMBODIMENTS

Figure 1:
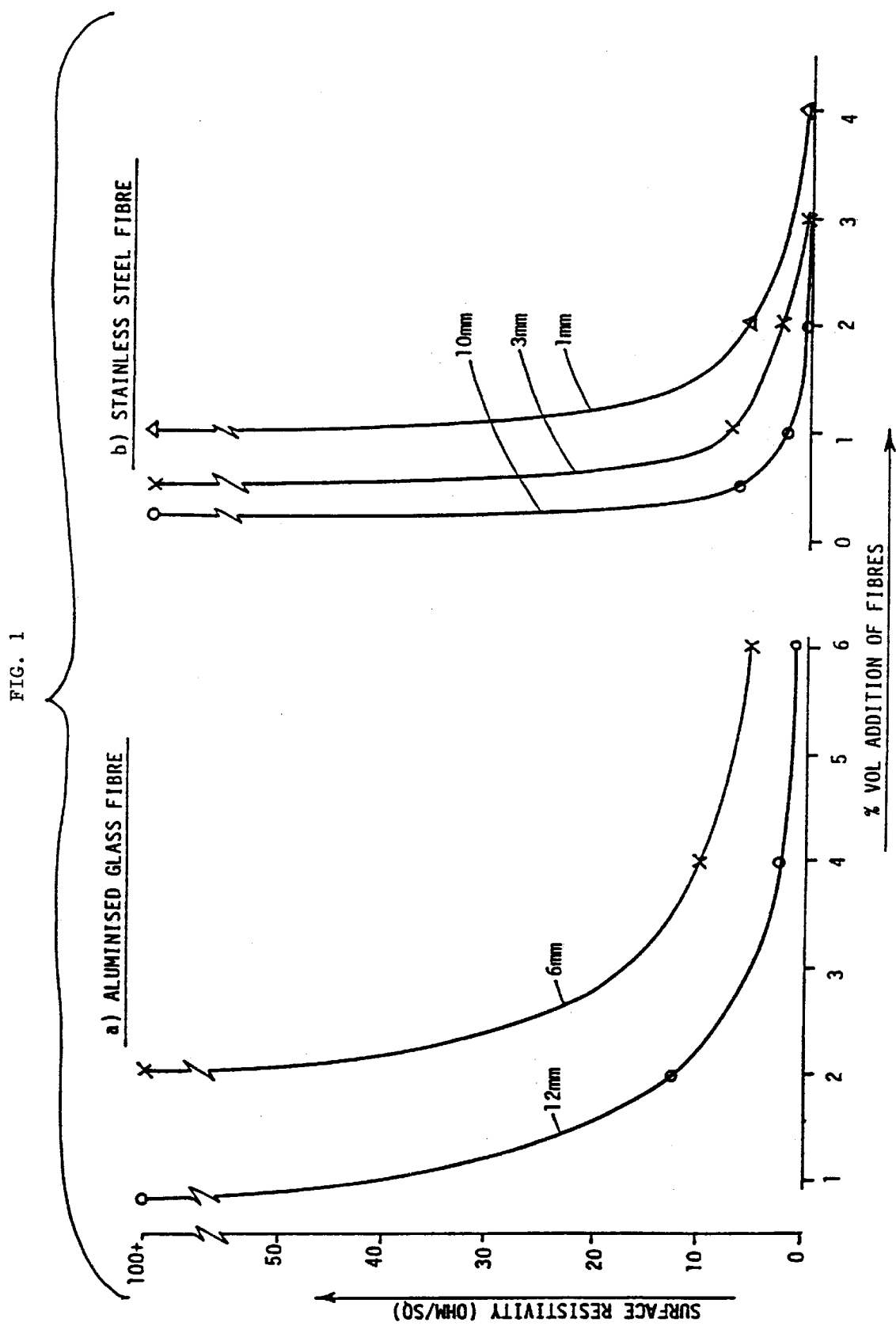
FIG. 1 is a graph which shows the effect of the length of the conductive fibers on surface resistivity according to the present invention.

The foamed dispersion may be formed using any suitable surfactant, for example sodium dodecyl benzene sulphonate at a concentration of 0.8% in water. The fibres may be reinforcing fibres as above defined but treated so as to render them conductive, for example by providing a metallic coating such as aluminium. Alternatively, the conductive fibres may be selected from the group consisting of steel, stainless steel, brass washed steel or other fibres of varying thicknesses, in which case non conductive reinforcing fibres, for example glass fibres, may be added in addition.

The foamed dispersion may be conveniently formed into a web and consolidated by the process and apparatus described in European Patent Application No. 85300031.3 corresponding to U.S. patent application Ser. No. 946,167 (now U.S. Pat. No. 4,734,321) (Publication No. 0 148 760), the subject matter of that application being incorporated by reference herein.

Preferably the fibres are in the form of single discrete fibres. When glass fibres are used, and are received in the form of chopped strand bundles, the bundles are broken down into single fibres as or before the aqueous dispersion is formed.

Fibers for forming the structure include glass, carbon and ceramic fibres and fibres such as the aramid fibres sold under the trade names Kevlar and Nomex, and will generally include any fibre having a modulus higher than 10,000 Mega Pascals.

Particulate plastics material is to be taken as including short plastics fibres which may be included to enhance the cohesion of the structure during manufacture.

In order to improve the electromagnetic attenuation provided by the structure, the conductive fibres may be concentrated in one layer so as to increase the number of crossover contact points in the conductive fibre lattice. However, where such fibres do not exhibit adequate reinforcing characteristics, a second layer containing only reinforcing fibres may be laminated thereto. In such a structure, the plastics matrix of each layer is preferably constituted by plastics material which is the same as or compatible with the other layer, so as to ensure good bonding between the layers after lamination.

The preferred method of forming the second layer is by laying it down from a second head box added to the wet end of the paper making machine described in European Patent Application No. 84300031.3 (Publication No. 0 148 760) corresponding to U.S. patent application Ser. No. 946,167 (now U.S. Pat. No. 4,734,321) the subject matter of that application being incorporated by reference herein. Alternatively, a two layer product may be formed as described in copending United Kingdom Patent Applications Nos. 8618726 corresponding to U.S. patent application Ser. No. 390,452 filed Aug. 3, 1989, which is a continuation of U.S. patent application Ser. No. 078,172, now abandoned and 8618727 corresponding to U.S. patent application Ser. No. 217,324 filed Jul. 11, 1988, which is a continuation of U.S. patent application Ser. No. 078,112, now abandoned the subject matter of these applications being incorporated by reference herein.

The measurement of resistivity was effected using samples of compacted material 150 mm long by 25 mm wide drilled to receive clamp electrodes spaced 100 mm apart. Each sample was conditioned at 50% RH, 20° C. for 24 hours and lightly abraded before being clamped by the electrodes against a non conductive surface. A constant current generator was connected across the electrodes and adjusted to 20 mA, the voltage then being measured after 30 seconds. The Resistance R was then calculated so that R/4 gave surface resistivity in ohms/square.

EMI attenuation was measured using a metal test chamber in which a receiving aerial connected to a receiver was located. The receiving aerial was spaced 9 inches from the centre of a square test aperture having 10 inch sides provided in the wall of the chamber. Outside the aperture, a transmitting aerial connected to a signal source was located, also at a spacing of 9 inches, so that the centre of the aperture and the two aerials were in alignment.

The EMI electrical field tests were carried out at 30 or 20 MHz to 1000 MHz with log spiral/Dipole aerials. In each case, a field strength reference level was first set up with an open aperture and the same signal source settings used when each sample was subsequently tested.

For each test, a 12 inch square sample of compacted material was drilled along the perimeter and bolted to the chamber so as to extend over the test aperture, conductive paint being applied over the contact area between the sample and chamber. The signal strength at the receiver compared with the reference level was then recorded in order to determine the attenuation achieved. The attenuation is defined as the ratio of field strength transmitted to field strength received and is recorded in decibels (dB). For each sample, two series of tests were performed, one with the aerials vertical and one with them horizontal these tests being identified as V and H respectively in these tables hereinbelow.

Compacted sheets were made according to the process of the invention, embodying non-conductive glass fibres to afford reinforcement, and conductive fibres of various kinds, as follows:

1. Aluminium coated glass fibres 6 mm and 12 mm long, each at various concentrations in a polypropylene matrix.
2. Stainless steel fibres sold by Bekaert under the trade name "Bekinox" type UG/PVA, 1 mm, 3 mm and 10 mm long, each at various concentrations in a matrix either of polypropylene or of polybutylene terephthalate sold by GE Plastics Inc. under the trade name "Valox".
3. Nickel coated carbon fibres 12 mm long in a matrix of "Valox".

The sheets so made were tested for surface resistivity and EMI attenuation by the procedures described above, and the results are set out in the attached Tables and Graphs in which:

Table 1 and the graph of FIG. 1 show the effect of the length of the conductive fibres on surface resistivity and hence the conductivity of plastics materials reinforced with such fibres according to the invention.

Figure 2:
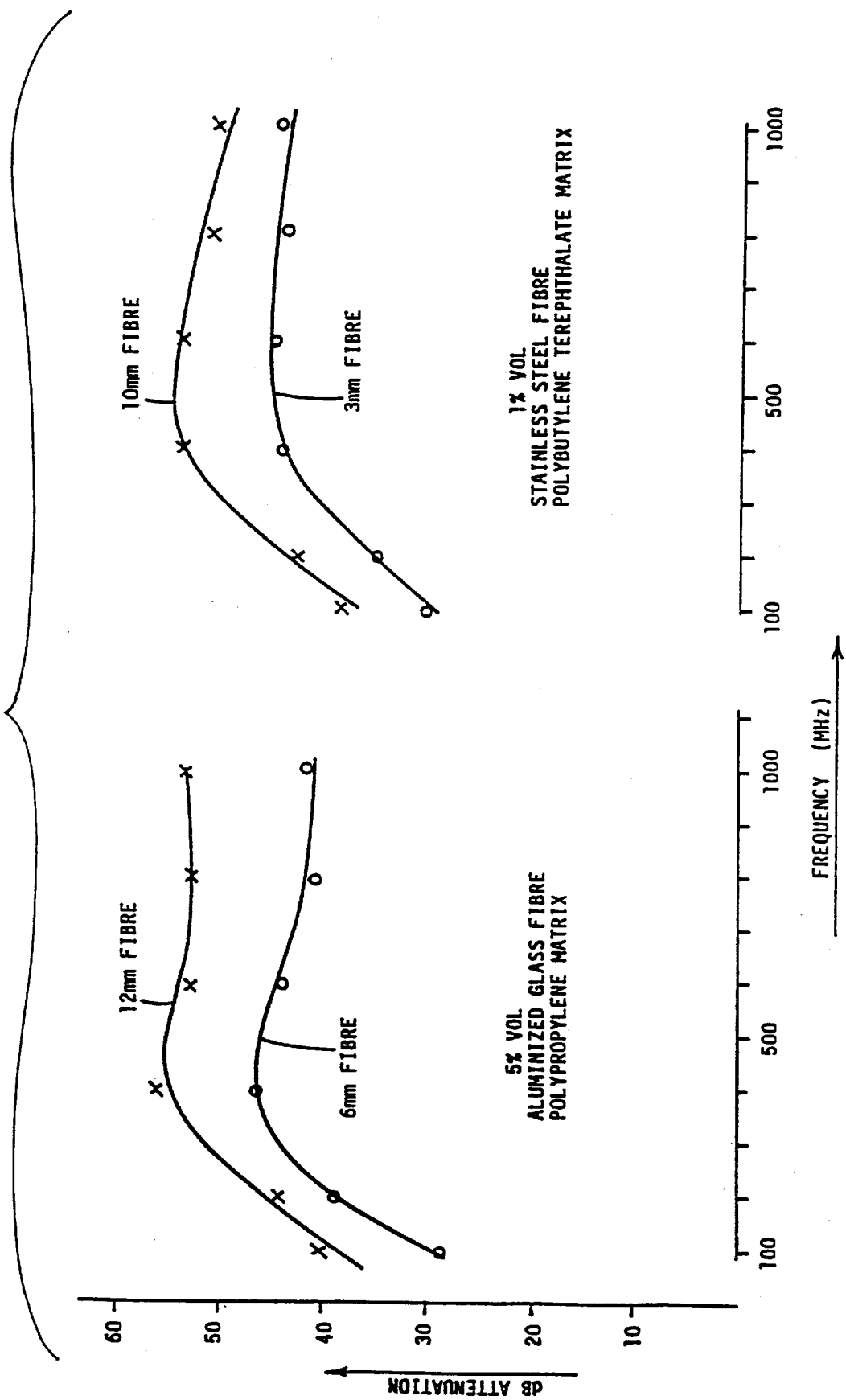
FIG. 2 is a graph which shows the effect of the length of the conductive fibers on EMI attenuation for Aluminum coated glass and stainless steel fibers.

Table 2a and the graph of FIG. 2 show the effect of the length of the conductive fibres on EMI attenuation for Aluminium coated glass fibres and stainless steel fibres.

Table 2b compares the EMI attenutation in mouldings produced from the same starting formulation of polypropylene and stainless steel fibres, but using different moulding processes. In one case, the material was injection moulded, a process which is known to reduce the fibres to lengths of 1 millimeter or less. In the other case, a material made according to the process of the invention was compression moulded and cooled into a consolidated state after preheating.

Figure 3:
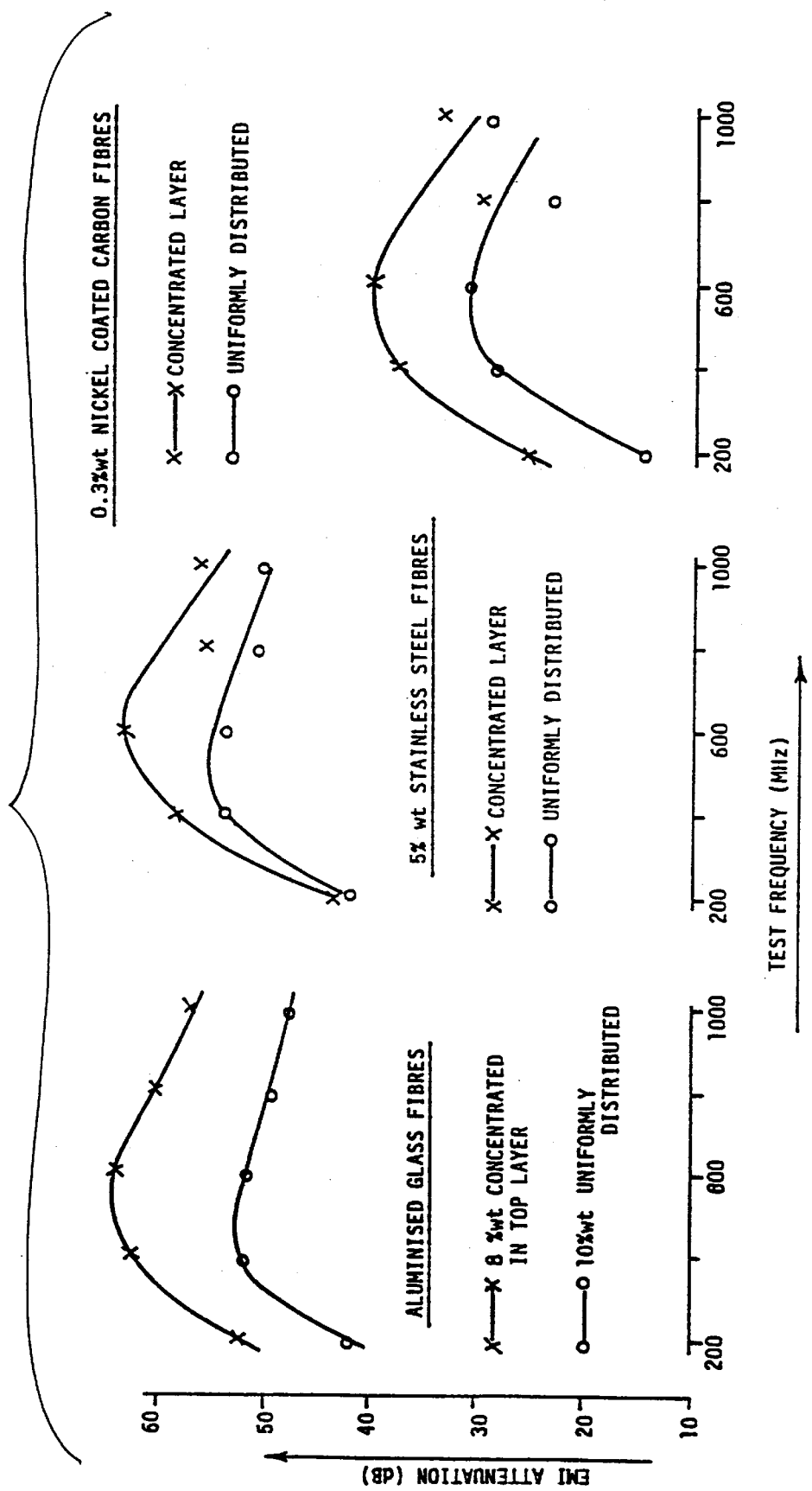
FIG. 3 is a graph which compares surface resistivity and EMI attenuation of samples in which conductive fibers are distributed uniformly with samples in which the fibers are concentrated.

Table 3 and the graph of FIG. 3 compares the surface resistivity (and hence conductivity) and EMI attenuation of samples in which conductive fibres are distributed uniformly with samples in which the conductive fibres are concentrated in a surface layer.

The tables and graphs show that for all structures of the kind described, there is evidence of a critical fibre length at which the conductivity of the fibre lattice embodied in the structure significantly increases, with a commensurate effect on EMI shielding efficiency. The particular fibre length at which this improvement occurs will however vary with the type of fibre and its thickness. In general, a reduction in thickness would appear to offset to some degree enhancement in conductivity resulting from increased fibre length is however usefully illustrated by aluminium coated glass fibres for which approximately twice the amount of 6 mm fibre is required to produce the same shielding performance as 12 mm aluminium coated glass fibres of the same thickness.

Table 3 and FIG. 3 show the improvement in terms of EMI shielding efficiency which can be achieved by concentrating the conductive fibres in a surface layer laminated to a fibre reinforced support layer.

Where the product is to be subjected to deep draw moulding or moulding into complex shapes requiring the fibres to conform to contorted flow patterns during moulding, it is desirable to provide a plastics matrix of low melt viscosity resin such as polypropylene, incorporating a lattice of conductive fibres capable of withstanding high shear forces, such as stainless steel fibres.

TABLE 1

The relationship between the length and concentration of conductive fibres in a consolidated polypropylene matrix having a total weight of 3000 grams per square meter and the surface resistivity (and hence conductivity) of the matrix.

| Volume % content of aluminized glass fibres 23 μm in diameter | Resistivity (ohm/sq) for fibre lengths | |
|---|---|---|
| | 6 mm | 12 mm |
| 0.8 | — | >100 |
| 2.0 | >100 | 13 |
| 4.0 | 10 | 1.6 |
| 6.0 | 5.1 | 0.3 |

TABLE 1-continued

| Volume % content stainless steel fibres 12 μm in diameter | 1 mm | 33 mm | 10mm |
|---|---|---|---|
| 0.2 | — | — | >100 |
| 0.5 | — | >100 | 6.9 |
| 1.0 | >100 | 7.2 | 2.3 |
| 2.0 | 6.1 | 2.8 | 0.6 |
| 3.0 | — | 0.3 | 0.2 |
| 4.0 | 0.6 | — | — |

Note:
In each sample, the fibre content was made up to a total of 12% by volume with glass fibres 13 mm long 11μ diameter

TABLE 2a

The effect of the length of the conductive fibres on EMI attenuation

| | 5% vol 23μ diameter Aluminium coated glass fibres 7% vol 13 min long, 11μ diameter glass fibres 88% vol Polypropylene | | | | 1% vol 12μ diameter Stainless steel fibres 11% vol Glass fibres 88% vol Polybutylene terephthalate | | | |
|---|---|---|---|---|---|---|---|---|
| Conductive fibre length | 6 mm | | 12 mm | | 3 mm | | 10 mm | |
| EMI attenuation (dB) | V | H | V | H | V | H | V | H |
| at:- 100 MHz | 29 | 27 | 40 | 40 | 29 | 32 | 38 | 39 |
| at:- 100 MHz | | | | | | | | |
| 200 | 41 | 37 | 42 | 47 | 37 | 34 | 43 | 42 |
| 400 | 48 | 45 | 55 | 58 | 41 | 47 | 56 | 52 |
| 600 | 45 | 42 | 49 | 56 | 43 | 48 | 54 | 53 |
| 800 | 43 | 40 | 52 | 53 | 43 | 44 | 53 | 48 |
| 1000 | 47 | 40 | 54 | 53 | 45 | 44 | 54 | 46 |

Notes:
1) Sample thickness 2.75 ± 0.25 mm
2) Attenuation values quoted are with the aerials in Vertical (V) and Horizontal (H) modes. These are averaged for graphical representation in FIG. 2

TABLE 2b

The effect of fibre length in a moulded sample
EMI attenuation tests carried out on rectangular section boxes moulded from fibre reinforced acrylonitrile butadiene styrene

| Sample | Field H = magnetic E = Electrical | dB Attenuation at | | | | |
|---|---|---|---|---|---|---|
| | | 10 | 40 | 100 | 400 | 1000 MHz |
| Injection moulded with material containing 1% vol Stainless Steel fibre effective length < 1 mm see Note | H | 1 | 0 | 0 | 0 | — |
| | E | 16 | 15 | 14 | 13 | 13 |
| Compression moulded with material containing 1% vol Stainless Steel fibre 10 mm long 12μ diameter | H | 8 | 18 | 30 | — | — |
| | E | — | — | 37 | 22 | 15 |

Note:
Injection moulding is known to cause fibre breakage, reducing the effective fibre length to 1 mm or less.

TABLE 3

Three examples showing the effect of EMI attenutation of concentrating conductive fibres in the surface layer of a consolidated thermoplastics sheet in comparison with such a sheet in which the same amount of conductive fibre is uniformly distributed.

| Example | Material | | Thickness (mm) | Surface Resistivity (ohm/sq) | 100 MHz V | 100 MHz H | 200 MHz V | 200 MHz H | 400 MHz V | 400 MHz H | 600 MHz V | 600 MHz H | 800 MHz V | 800 MHz H | 1000 MHz V | 1000 MHz H |
|---|---|---|---|---|---|---|---|---|---|---|---|---|---|---|---|---|
| 1 | 10% Aluminium coated glass fibre<br>15% Glass fibres<br>75% Polypropylene | Unstructured | 2.8 | 6.2 | 34 | 35 | 43 | 41 | 53 | 52 | 51 | 52 | 51 | 47 | 52 | 43 |
|   | 25% Aluminium coated glass fibre<br>75% Polypropylene<br>25% Glass fibres<br>75% Polypropylene | Top ⅓ layer<br>Lower ⅔ layer | 2.9 | 1.2 | 47 | 48 | 50 | 55 | 64 | 61 | 66 | 62 | 60 | 60 | 62 | 52 |
| 2 | 5% Stainless Steel fibres<br>19% Glass fibres<br>76% Polybutylene terephthalate | Unstructured | 2.5 | 5.2 | 38 | 39 | 43 | 42 | 56 | 52 | 54 | 53 | 53 | 48 | 54 | 46 |
|   | 15% Stainless Steel fibres<br>14% Glass fibres<br>71% Polybutylene terephthalate<br>21% Glass fibres<br>79% Polybutylene terephthalate | Top ⅓ layer<br>Lower ⅔ layer | 2.7 | 1.1 | 41 | 36 | 42 | 45 | 56 | 61 | 61 | 66 | 57 | 54 | 58 | 54 |
| 3 | 0.3% Nickel carbon fibres<br>29.7% Glass fibres<br>70% Polybutylene terephthalate | Unstructured | 2.0 | >100 | 3 | 4 | 16 | 13 | 34 | 23 | 35 | 27 | 24 | 20 | 30 | 29 |
|   | 1.2% Nickel coated carbon fibres<br>28.8% Glass fibres<br>70% Polubutylene terephthalate<br>70% Glass fibres<br>70% Polybutylene terephthalate | Top ¼ layer<br>Lower ¾ layer | 2.0 | 16 | 15 | 16 | 23 | 27 | 39 | 36 | 44 | 36 | 28 | 30 | 29 | |

Notes:
1. % contents are by weight.
2. Aluminium coated glass fibres are 12 mm long 23μ diameter
Stainless steel fibres are 10 mm long 12μ diameter
Nickel coated carbon fibres 12 mm long 9μ diameter
3. Attenuation values quoted are for Vertical (V) and Horizontal (H) modes.
These are averaged for graphical representation in FIG. 3.

We claim:

1. A method of making an element which can be formed into shielding for providing improved attenuation of electrical or magnetic fields comprising the steps of:
    forming a foamed aqueous disposition of a mixture of thermoplastic moldable particulate plastics material, single discrete reinforcing fibers and single discrete conductive fibers each comprising a conductive surface,
    said particulate plastics material being selected from the group consisting of polypropylene and polybutylene terephthalate,
    said reinforcing fibers being between about 7 and 50 millimeters long, having a modulus of elasticity higher than about 10,000 Mega Pascals and constituting between about 5% and about 35% of the mixture by volume,
    said conductive fibers being between about 10 and 20 millimeters long and consisting 7% or less of the mixture by volume,
    laying down and draining said disposition on a foraminous support so as to form a web; and
    drying and bonding the fibrous and plastics components together to form a moldable element.

2. The method as claimed in claim 1, wherein the conductive fibers are between 10 and 15 millimeters in length.

3. The method as claimed in claim 1, wherein the conductive fibers comprise reinforcing fibers which are treated to render them conductive.

4. The method as claimed in claim 3, wherein the conductive fibers comprise aluminum coated glass fibers.

5. The method as claimed in claim 1, wherein the conductive fibers are selected from the group consisting of steel, stainless steel, and brass washed steel.

6. The method as claimed in claim 1, wherein the moldable element is compacted under heat and pressure and then cooled to form a consolidated element in which the conductive fibers extend as a conductive lattice.

7. The method as in claim 6, wherein the compacted element comprises a shaped molding.

8. The method as claimed in claim 1, wherein a second aqueous dispersion is formed from a mixture of particulate plastics material and single discrete reinforcing fibers between about 7 and about 50 millimeters long, said second dispersion being laid down on said web so as to form a second web thereon, said first and second webs being simultaneously drained to form a moldable element having two layers.

9. The method as claimed in claim 1, including the further step of adding a second layer in which the fiber content comprises between about 5% and about 35% of the mixture and in which the fibers are reinforcing fibers.

* * * * *